United States Patent
Noda et al.

(10) Patent No.: US 11,364,486 B2
(45) Date of Patent: Jun. 21, 2022

(54) SUPPORTED CATALYST AND METHOD OF PRODUCING FIBROUS CARBON NANOSTRUCTURES

(71) Applicants: WASEDA UNIVERSITY, Tokyo (JP); ZEON CORPORATION, Tokyo (JP)

(72) Inventors: Suguru Noda, Tokyo (JP); Kosuke Kawabata, Tokyo (JP); Takayoshi Hongo, Tokyo (JP)

(73) Assignees: WASEDA UNIVERSITY, Tokyo (JP); ZEON CORPORATION, Tokyo (JP)

( * ) Notice: Subject to any disclaimer, the term of this patent is extended or adjusted under 35 U.S.C. 154(b) by 535 days.

(21) Appl. No.: 16/078,737

(22) PCT Filed: Feb. 17, 2017

(86) PCT No.: PCT/JP2017/005989
§ 371 (c)(1),
(2) Date: Aug. 22, 2018

(87) PCT Pub. No.: WO2017/145950
PCT Pub. Date: Aug. 31, 2017

(65) Prior Publication Data
US 2019/0046959 A1    Feb. 14, 2019

(30) Foreign Application Priority Data
Feb. 27, 2016 (JP) .............................. JP2016-036477

(51) Int. Cl.
*B01J 23/745* (2006.01)
*B01J 23/94* (2006.01)
(Continued)

(52) U.S. Cl.
CPC ............. *B01J 23/745* (2013.01); *B01J 21/12* (2013.01); *B01J 23/74* (2013.01); *B01J 23/94* (2013.01);
(Continued)

(58) Field of Classification Search
CPC ...................................................... B01J 23/745
(Continued)

(56) References Cited

U.S. PATENT DOCUMENTS 6,419,998 B1 *  7/2002  McGrath .................. B01J 23/50
                                                        427/523
2009/0230023 A1  9/2009  Idemitsu et al.
(Continued)

FOREIGN PATENT DOCUMENTS

CN    101959793 A    1/2011
WO    2008001709 A1  1/2008
(Continued)

OTHER PUBLICATIONS

Mar. 21, 2017, International Search Report issued in the International Patent Application No. PCT/JP2017/005989.
(Continued)

*Primary Examiner* — Douglas B Call
(74) *Attorney, Agent, or Firm* — Kenja IP Law PC

(57) ABSTRACT

A supported catalyst comprises: a support that is particulate; and a composite layer laminate formed outside the support and including two or more composite layers, wherein each of the composite layers includes a catalyst portion containing a catalyst and a metal compound portion containing a metal compound, the support contains 10 mass % or more of each of Al and Si, and a volume-average particle diameter of the support is 50 μm or more and 400 μm or less.

9 Claims, 2 Drawing Sheets

(51) Int. Cl.

| | |
|---|---|
| *C01B 32/162* | (2017.01) |
| *B01J 21/12* | (2006.01) |
| *B01J 35/02* | (2006.01) |
| *B01J 35/10* | (2006.01) |
| *B01J 38/12* | (2006.01) |
| *C23C 16/01* | (2006.01) |
| *C23C 16/26* | (2006.01) |
| *B01J 37/02* | (2006.01) |
| *B01J 37/08* | (2006.01) |
| *B01J 37/14* | (2006.01) |
| *B01J 23/74* | (2006.01) |
| *C23C 28/00* | (2006.01) |
| *C23C 16/40* | (2006.01) |
| *C23C 16/44* | (2006.01) |
| *D01F 9/127* | (2006.01) |
| *B01J 29/89* | (2006.01) |
| *B82Y 30/00* | (2011.01) |
| *B82Y 40/00* | (2011.01) |

(52) U.S. Cl.
CPC ......... *B01J 35/026* (2013.01); *B01J 35/1009* (2013.01); *B01J 37/0217* (2013.01); *B01J 37/0219* (2013.01); *B01J 37/0228* (2013.01); *B01J 37/0238* (2013.01); *B01J 37/0244* (2013.01); *B01J 37/086* (2013.01); *B01J 37/14* (2013.01); *B01J 38/12* (2013.01); *C01B 32/162* (2017.08); *C23C 16/01* (2013.01); *C23C 16/26* (2013.01); *C23C 16/403* (2013.01); *C23C 16/4417* (2013.01); *C23C 28/322* (2013.01); *C23C 28/345* (2013.01); *D01F 9/127* (2013.01); *B01J 29/89* (2013.01); *B82Y 30/00* (2013.01); *B82Y 40/00* (2013.01); *Y02P 20/584* (2015.11)

(58) Field of Classification Search
USPC .......................................................... 502/100
See application file for complete search history.

(56) References Cited

U.S. PATENT DOCUMENTS

| | | |
|---|---|---|
| 2011/0085961 A1 | 4/2011 | Noda et al. |
| 2012/0028788 A1* | 2/2012 | Manoylova ............ B01J 29/126 502/1 |
| 2014/0072505 A1 | 3/2014 | Fonseca et al. |
| 2015/0238950 A1* | 8/2015 | Kim .................... B01J 35/0006 428/403 |

FOREIGN PATENT DOCUMENTS

| | | | |
|---|---|---|---|
| WO | 2009110591 A1 | | 9/2009 |
| WO | WO 2015008988 | * | 1/2015 |

OTHER PUBLICATIONS

Aug. 28, 2018, International Preliminary Report on Patentability issued in the International Patent Application No. PCT/JP2017/005989.

Sep. 25, 2019, the Extended European Search Report issued by the European Patent Office in the corresponding European Patent Application No. 17756389.7.

Alan M. Cassell et al., Large Scale CVD Synthesis of Single-Walled Carbon Nanotubes, J. Phys. Chem. B, 1999, pp. 6484-6492, vol. 103, No. 31.

Á. Kukovecz et al., Catalytic synthesis of carbon nanotubes over Co, Fe and Ni containing conventional and sol-gel silica-aluminas, Phys. Chem. Chem. Phys., 2000, pp. 3071-3076, vol. 2, No. 13.

* cited by examiner

SUPPORTED CATALYST AND METHOD OF PRODUCING FIBROUS CARBON NANOSTRUCTURES

TECHNICAL FIELD

The present disclosure relates to a supported catalyst and a method of producing fibrous carbon nanostructures, and particularly relates to a particulate supported catalyst and a method of producing fibrous carbon nanostructures using the supported catalyst.

BACKGROUND

In recent years, fibrous carbon materials and especially fibrous carbon nanostructures such as carbon nanotubes (hereafter also referred to as "CNTs") have been attracting attention as materials excellent in electrical conductivity, thermal conductivity, and mechanical characteristics. CNTs are formed by cylindrical graphene sheets composed of carbon atoms, and have diameters of the order of nanometers.

Fibrous carbon nanostructures such as CNTs are generally more expensive than other materials because of high production cost. Accordingly, the uses of fibrous carbon nanostructures such as CNTs are limited, despite their excellent characteristics mentioned above. In recent years, a chemical vapor deposition (CVD) method using a catalyst (hereafter also referred to as "catalytic CVD method") has been employed as a production method capable of producing CNTs and the like with relatively high efficiency. Even with the catalytic CVD method, however, the production cost cannot be reduced sufficiently.

In view of this, the following CNT production method has been developed: Porous particles, ceramic beads, or the like are used as a support instead of a substrate, and a fluidized bed is formed with a supported catalyst having a structure in which a catalyst carrier layer is formed on the support and a catalyst is supported by the catalyst carrier layer, to synthesize CNTs (for example, see WO 2009/110591 A1 (PTL 1)). Specifically, PTL 1 discloses a production method whereby alumina beads are used as a support and a fluidized bed is formed with a supported catalyst obtained by forming a catalyst carrier layer on the alumina beads by $Al_2O_3$ and supporting a Fe catalyst on the catalyst carrier layer, to synthesize CNTs.

CITATION LIST

Patent Literatures

PTL 1: WO 2009/110591 A1

SUMMARY

Technical Problem

As mentioned above, there has been demand to reduce production cost in CNT production methods. For example, regarding the catalytic CVD method, this may be achieved by repeatedly using the supported catalyst. However, repeatedly using the supported catalyst has the possibility that the supported catalyst itself degrades and, when used in CNT production, is damaged and mixed in the resultant CNTs as impurities. Besides, alumina beads are relatively expensive. Furthermore, in the case where a fluidized bed is formed in a CNT production device using a supported catalyst obtained using, as a support, alumina beads made of alumina with relatively high hardness and CNTs are synthesized, repeatedly using the supported catalyst is likely to gradually wear the CNT production device. If the wearing of the CNT production device continues, there is a possibility that not only the device fails eventually but also impurities such as wear fragments of the device are mixed in the resultant CNTs. Thus, conventional CNT production methods leave room for improvement in CNT production efficiency and CNT quality.

It could therefore be helpful to provide a supported catalyst that enables highly efficient synthesis of high-quality fibrous carbon nanostructures, and a method of producing fibrous carbon nanostructures using the supported catalyst.

Solution to Problem

The inventors conducted extensive studies to solve the problems stated above. In view of the above-mentioned problem of a decrease in CNT quality due to wear of the production device caused by a supported catalyst formed using a support having relatively high hardness, one way of suppressing wear of the production device may be to use a support having relatively low hardness. However, further studies by the inventors revealed that, if the hardness of the support is excessively low, repeatedly using a supported catalyst formed using the support causes a problem in that the supported catalyst wears or becomes defective and impurities derived from the supported catalyst are mixed in the CNTs, and the supported catalyst fractures and cannot be reused. The inventors then discovered that the production efficiency of fibrous carbon nanostructures and the quality of fibrous carbon nanostructures can be improved with favorable balance, by forming a fluidized bed using a supported catalyst of a specific structure including a support having a specific composition and producing fibrous carbon nanostructures.

To advantageously solve the problems stated above, a presently disclosed supported catalyst comprises: a support that is particulate; and a composite layer laminate formed outside the support, wherein the composite layer laminate is composed of n composite layers, where n is an integer of 2 or more, each of the composite layers in the composite layer laminate includes a catalyst portion containing a catalyst and a metal compound portion containing a metal compound, the support contains 10 mass % or more of each of Al and Si, and a volume-average particle diameter of the support is 50 μm or more and 400 μm or less. Such a supported catalyst that has two or more composite layers each including a catalyst portion and a metal compound portion outside a support having a volume-average particle diameter of 50 μm or more and 400 μm or less and containing 10 mass % or more of each of Al and Si enables highly efficient synthesis of high-quality fibrous carbon nanostructures.

As used herein, the term "particulate" denotes a structure with an aspect ratio of less than 5. For example, the value of (maximum diameter/width orthogonal to maximum diameter) is calculated for each of a plurality of randomly selected particles on a microscope image of particles, and their average value is taken to be the aspect ratio of the particles.

As used herein, the number of composite layers can be determined by performing cross-sectional observation using an electron microscope or performing composition analysis by X-ray photoelectron spectroscopy while sputtering with Ar+ions.

As used herein, the "volume-average particle diameter of the support" can be measured in accordance with, for example, JIS Z8825, and represents a particle diameter (D50) at which, in a particle size distribution (volume basis) measured by laser diffraction, the cumulative volume calculated from a small diameter end of the distribution reaches 50%.

Preferably, in the presently disclosed supported catalyst, the metal compound portion contains 10 mass % or more of Al. If the metal compound portion of the composite layer contains 10 mass % or more of Al, performance as a supported catalyst can be further improved.

Preferably, in the presently disclosed supported catalyst, the catalyst portion contains at least metal of any of Fe, Co, and Ni. If the catalyst portion contains any of Fe, Co, and Ni, performance as a supported catalyst can be further improved.

Preferably, in the presently disclosed supported catalyst, the composite layer in the composite layer laminate includes a metal compound layer which is the metal compound portion in layer form, a catalyst layer which is the catalyst portion in layer form, and/or a mixed layer (single layer) in which the metal compound and the catalyst coexist. In this way, performance as a supported catalyst can be further improved.

Preferably, in the presently disclosed supported catalyst, a catalyst metal equivalent thickness of the catalyst contained in the composite layer is 0.1 nm or more and 10 nm or less per one composite layer. If the catalyst metal equivalent thickness is in this range, performance as a supported catalyst can be further improved.

As used herein, the "catalyst metal equivalent thickness" is the ratio a/b (cm)=$10^7$a/b (nm) between a (g/cm$^2$) which is the amount of the catalyst metal per unit area of one composite layer and b (g/cm$^3$) which is the true density of the catalyst metal. Such thickness is a value obtained by, for example, measuring characteristic X-ray intensity for the supported catalyst by an energy dispersive X-ray spectrometer included with a scanning electron microscope, comparing the obtained characteristic X-ray intensity measurement value with a calibration curve acquired beforehand, and dividing it by the number n of composite layers. This value is an average value of catalyst metal equivalent thickness per layer of the whole catalyst included in the supported catalyst. The calibration curve may be a calibration curve acquired using a standard plate of the catalyst metal.

Preferably, in the presently disclosed supported catalyst, a metal compound equivalent thickness of the metal compound contained in the composite layer is 1 nm or more and 1 μm or less per one composite layer. If the metal compound equivalent thickness is in this range, performance as a supported catalyst can be further improved.

As used herein, the "metal compound equivalent thickness" is the ratio c/d (cm)=$10^7$c/d (nm) between c (g/cm$^2$) which is the amount of the metal compound per unit area of one composite layer and d (g/cm$^3$) which is the true density of the metal compound. Such thickness can be determined in the same way as the above-mentioned catalyst metal equivalent thickness.

Preferably, the presently disclosed supported catalyst includes five or more composite layers. A supported catalyst including five or more composite layers has excellent catalytic activity.

Preferably, the presently disclosed supported catalyst has a specific surface area of 1 m$^2$/g or less. If the specific surface area of the supported catalyst is 1 m$^2$/g or less, fibrous carbon nanostructures can be easily separated from the supported catalyst.

As used herein, the specific surface area of the supported catalyst can be measured using a BET method.

To advantageously solve the problems stated above, a presently disclosed method of producing fibrous carbon nanostructures comprises: a step of synthesizing fibrous carbon nanostructures on the supported catalyst described above; and a peeling step of peeling the fibrous carbon nanostructures from the supported catalyst. By synthesizing fibrous carbon nanostructures on the supported catalyst described above and peeling the fibrous carbon nanostructures from the supported catalyst, high-quality fibrous carbon nanostructures can be obtained with high efficiency.

Preferably, the presently disclosed method of producing fibrous carbon nanostructures comprises a supported catalyst regeneration step of subjecting the supported catalyst after the peeling step to a supported catalyst regeneration process. This further improves the production efficiency of fibrous carbon nanostructures.

Preferably, in the presently disclosed method of producing fibrous carbon nanostructures, the supported catalyst regeneration step includes: a step of oxidizing a surface of the supported catalyst to obtain a reusable supported catalyst; and a catalyst resupporting step of forming the composite layer including the metal compound portion and the catalyst portion, on a surface of the reusable supported catalyst. This further improves the production efficiency of fibrous carbon nanostructures.

A presently disclosed supported catalyst may have fibrous carbon nanostructures on a surface thereof.

Advantageous Effect

It is therefore possible to provide a supported catalyst that enables highly efficient synthesis of high-quality fibrous carbon nanostructures.

It is also possible to synthesize high-quality fibrous carbon nanostructures with high efficiency.

DETAILED DESCRIPTION

Figure 1:
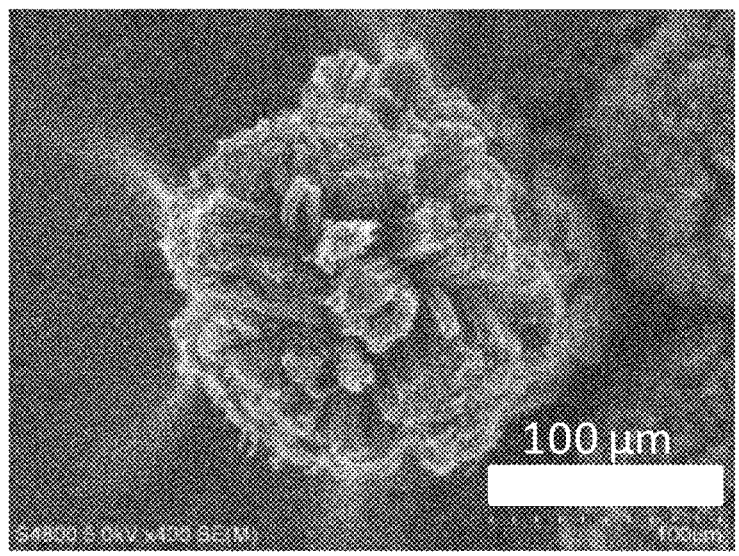
FIG. 1 is a scanning electron microscope (SEM) image of a supported catalyst having CNTs on its surface.

One of the disclosed embodiments is described in detail below.

A presently disclosed supported catalyst can be used to form a static bed, a fluidized bed, or a moving bed to produce fibrous nanostructures. A presently disclosed method of producing fibrous carbon nanostructures uses the static bed, fluidized bed, or moving bed formed by the presently disclosed supported catalyst. As used herein, the term "fibrous carbon nanostructures" includes carbon nanotubes, carbon nanofibers, and the like.

The presently disclosed supported catalyst includes a particulate support, and two or more composite layers formed outside the support. Each of the composite layers includes a catalyst portion and a metal compound portion. In the presently disclosed supported catalyst, the support is made of a material containing 10 mass % or more of each of Al and Si, and has a volume-average particle diameter of 50 μm or more and 400 μm or less.

The supported catalyst is a substance that, when a static bed, a fluidized bed, or a moving bed is formed using the supported catalyst and a source gas containing a carbon source is supplied to set predetermined synthesis conditions, enables fibrous carbon nanostructures to grow on a supported catalyst.

<Support>

A support is particles outside which composite layers can be formed. Herein, "formed outside" not only means that the composite layers are formed directly on the outer surface of the support, but also includes a structure in which, for example, an underlayer such as a composite layer formation assisting layer is optionally formed on the outer surface of the support and the composite layers are formed on the underlayer. The composite layer formation assisting layer is a layer for improving close adherence between the composite layers and the support or facilitating composite layer forming reaction, and may be formed by an oxide, nitride, or carbide of any of various metals, or a composite material thereof.

[Support Material]

The material of the support needs to contain 10 mass % or more of each of Al and Si. Although it is not clear why a material containing 10 mass % or more of each of Al and Si is suitable as the support of the presently disclosed supported catalyst, the reason is presumed to be as follows. When the content of the $Al_2O_3$ component is high, the density and hardness of the support increase and a problem of wear of device walls arises. When the content of the $SiO_2$ component is high, the hardness of the support decreases and the support is damaged. If the support has the composition mentioned above, the hardness and elasticity of the support are moderate, and the bulk density of the support is suitable for fluidity. Hence, in the production of fibrous carbon nanostructures, wear of the production device can be suppressed and favorable fluidity can be exhibited, with it being possible to achieve both high quality and high production efficiency of fibrous carbon nanostructures. The Al content in the material of the support is more preferably 20 mass % or more, and further preferably 30 mass % or more. The Si content in the material of the support is more preferably 12 mass % or more, and further preferably 15 mass % or more. The ratio between Al and Si, expressed as (Al/Si) by mass, is preferably 0.3 or more, more preferably 1 or more, and further preferably 1.5 or more, and is preferably 5 or less, more preferably 3 or less, and further preferably 2.5 or less. This further improves the quality and production efficiency of the resultant fibrous carbon nanostructures.

An example of the material having such a composition is an aluminosilicate expressed by the general formula $xM_2O \cdot yAl_2O_3 \cdot zSiO_2 \cdot nH_2O$ [where M denotes a metal atom and x to z and n denote the molar numbers of the respective components]. Examples of such a material include mullite and various zeolites. Mullite is particularly preferable as the support material, because it further enhances the production efficiency of fibrous carbon nanostructures.

The support may be particles made of an aluminosilicate having some kind of underlayer on the surface. The material of the underlayer may be the same as the material (Fe, Co, Ni, etc.) forming the below-mentioned catalyst.

[Volume-Average Particle Diameter D50]

The volume-average particle diameter D50 of the support needs to be 50 μm or more and 400 μm or less. If the volume-average particle diameter D50 is in this range, fluidity and handleability are excellent in the production of fibrous carbon nanostructures, so that the production efficiency can be enhanced.

[Specific Surface Area]

In the case where fibrous carbon nanostructures grow outward from the surface of the supported catalyst, the fibrous carbon nanostructures can be easily separated from the supported catalyst in a subsequent step. If the supported catalyst is porous, the supported catalyst and the fibrous carbon nanostructures are entwined complexly. It is therefore desirable to form the supported catalyst using support particles having approximately smooth surfaces. Accordingly, the specific surface area of the support is preferably 1 $m^2/g$ or less, further preferably 0.3 $m^2/g$ or less, and even more preferably 0.1 $m^2/g$ or less. The specific surface area of the supported catalyst formed using such a support preferably satisfies the same numerical range.

[Density]

The bulk density of the support is preferably 1.0 $g/cm^3$ or more and more preferably 1.5 $g/cm^3$ or more, and is preferably 3.0 $g/cm^3$ or less and more preferably 2.5 $g/cm^3$ or less. The true density of the support is preferably 2.0 $g/cm^3$ or more and more preferably 2.5 $g/cm^3$ or more, and is preferably 4.0 $g/cm^3$ or less and more preferably 3.5 $g/cm^3$ or less. The bulk density of the support can be measured in accordance with HS Z 2504. If the bulk density or true density of the support is not less than the above-mentioned lower limit, the supported catalyst has favorable fluidity in the production of fibrous carbon nanostructures, so that the production efficiency can be further improved.

<Composite Layer Laminate>

A composite layer laminate is a laminate including n composite layers. Each composite layer includes a catalyst portion containing a catalyst and a metal compound portion containing a metal compound. Herein, the "catalyst portion" and the "metal compound portion" may each be formed in layer form so as to approximately entirely cover the supported catalyst surface, as a "catalyst layer" and a "metal compound layer" respectively. In this case, the composite layer is a laminate obtained by stacking the catalyst layer and the metal compound layer. Alternatively, the "catalyst portion" and the "metal compound portion" may be scattered in one layer (hereafter also referred to as "mixed layer") in which the metal compound and the catalyst coexist, without each forming a layer. In this case, the composite layer is the mixed layer. Alternatively, the composite layer may include the "metal compound layer" and the "mixed layer". The composite layer may include the "metal compound layer" and the "catalyst layer". The composite layer may include the "catalyst layer", the "metal compound layer", and the "mixed layer", or include at least two layers of any one of these three types of layers. In other words, the composite layer may be formed by stacking a plurality of layers different in composition or property, or a single layer in which constituent parts made of components different in composition or property coexist.

[Metal Compound Portion]

The metal compound portion is a portion that is used together with the catalyst and functions co-catalytically by, for example, supporting the catalyst. The material forming the metal compound portion may be, for example, metal oxide. The metal compound portion may be formed by, for example, a material containing one or more elements selected from the group consisting of Si, Al, and Mg. For example, the metal compound portion is preferably made of at least one metal compound selected from the group consisting of oxides such as $SiO_2$, $Al_2O_3$, and MgO, nitrides such as $Si_3N_4$ and AlN, carbides such as SiC, and composites thereof. Moreover, the metal compound portion preferably contains 10 mass % or more of Al, more preferably contains 25 mass % or more of Al, and further preferably contains 45 mass % or more of Al. The metal compound portion is preferably made of aluminum oxide such as $Al_2O_3$. If the metal compound portion contains 10 mass % or more of Al, the affinity with the support containing 10 mass % or more of Al increases, and performance as a supported catalyst can be further improved. In terms of efficiency, a material containing 3 mass % or more of Al is preferably used in the formation of the metal compound portion.

The metal compound portion can be formed by, for example, (1) a method of bringing a solution containing the material forming the metal compound portion into contact with the support surface (the underlayer surface in the case where the underlayer is provided) or the catalyst portion surface and drying it (i.e. wet supporting method), or (2) a method of bringing the sputtered or gasified material of the metal compound portion into contact with the support surface or the catalyst portion surface (i.e. dry supporting method).

In particular, in the case of the dry supporting method of (2) whereby the gasified metal compound portion material is brought into contact with the surface to form the metal compound portion, for example, the metal compound portion made of aluminum oxide can be formed by supplying aluminum isopropoxide (chemical formula: $Al(O-i-Pr)_3$ [i-Pr is isopropyl group-$CH(CH_3)_2$]) gas, oxygen, and nitrogen at a predetermined flow rate into a reactor the inside of which has been heated to a reaction temperature. The reaction temperature in this method is typically 400° C. or more and 1200° C. or less.

In the case of forming the metal compound portion not on the support but on the supported catalyst, too, the material in a gaseous state is supplied into the reactor in the same way as above. Forming the metal compound portion and the catalyst portion not on the support but on the supported catalyst is hereafter also referred to as "catalyst resupporting".

The inventors conducted further studies to determine the suitable thickness of the metal compound portion. The inventors then discovered that there is a correlation between the suitable metal compound equivalent thickness of the metal compound portion in layer form (i.e. metal compound layer) and the suitable catalyst metal equivalent thickness of the catalyst portion in layer form (i.e. catalyst layer). Specifically, when the equivalent thickness of the metal compound is thick, the equivalent thickness of the catalyst metal needs to be thick, too. Further analysis by the inventors, however, revealed that when the equivalent thickness of the catalyst metal increases, the diameter of fine metal particles contained in the composite layer coarsens. As a result, in the case of synthesizing fibrous carbon nanostructures, the resultant fibrous carbon nanostructures tend to increase in diameter. Analysis also revealed that, in order to uniformly form the metal compound portion, it is preferable to form the metal compound portion with a certain degree of equivalent thickness. Accordingly, the equivalent thickness of the metal compound is preferably 1 nm or more and more preferably 5 nm or more, and is preferably 1 µm or less and more preferably 100 nm or less. If the equivalent thickness of the metal compound is in this range, the metal compound portion can be favorably formed outside the support, and the catalyst portion can be favorably supported by the metal compound portion. This further improves the production efficiency and quality of fibrous carbon nanostructures. The equivalent thickness of the metal compound can be adjusted by, for example, changing the flow rate or concentration of the gas supplied in the formation of the metal compound portion or the time of the metal compound portion formation step. Specifically, the metal compound portion can be made thicker by at least one of: increasing the flow rate of the gas; increasing the concentration of the metal compound portion material in the gas; and increasing the time of the metal compound portion formation step. Conversely, the metal compound portion can be made thinner by at least one of: decreasing the flow rate of the gas; decreasing the concentration of the metal compound portion material in the gas; and decreasing the time of the metal compound portion formation step.

[Catalyst Portion]

The catalyst portion is a portion containing a catalyst that contributes to the synthesis of fibrous carbon nanostructures, and contains fine catalyst metal particles as a catalyst. The catalyst portion preferably contains catalyst metal of any of Fe, Co, and Ni. Further, the catalyst portion is preferably formed using a catalyst material containing 3 mass % or more of a catalyst metal component of any of Fe, Co, and Ni. If the catalyst portion is formed using a catalyst material containing 3 mass % or more of a catalyst metal component of any of Fe, Co, and Ni, the production efficiency of fibrous carbon nanostructures can be further improved. Examples of such a catalyst material include: Fe-containing catalyst materials such as tris(2,4-pentanedionato)iron(III), bis(cyclopentadienyl)iron(II) (hereafter also referred to as "ferrocene"), iron(III) chloride, iron(III) nitrate, and iron carbonyl; Co-containing catalyst materials such as tris(2,4-pentanedionato)cobalt(III), bis(cyclopentadienyl)cobalt(II), cobalt(II) chloride, and cobalt(II) nitrate; and Ni-containing catalyst materials such as bis(2,4-pentanedionato)nickel(II) and bis(cyclopentadienyl)nickel(II). In particular, ferrocene containing about 30 mass % of Fe is preferable as the catalyst material, because it contributes to favorable catalyst portion formation efficiency.

The catalyst portion can be formed by, for example, (1) a method of bringing a solution containing the catalyst material into contact with the support having the metal compound portion and drying it (i.e. wet supporting method), or (2) a method of bringing the sputtered or gasified catalyst material into contact with the support having the metal compound portion (i.e. dry supporting method). The catalyst material may be brought into contact with the support before forming the metal compound portion on the support. Alternatively, the catalyst material may be brought into contact with the support at the same time as forming the metal compound portion on the support. Metal is unstable at its surface, and accordingly is stabilized by reducing the surface area. When the temperature is higher, catalyst metal atoms can diffuse over a longer distance in the composite layer, and catalyst metal atoms gather from a wider area and form particles, so that the number density decreases and the particle diameter increases. In the case where the catalyst metal equivalent thickness of the catalyst included in the composite layer of the supported catalyst, the ambient temperature, and the like satisfy predetermined conditions, the catalyst metal forms fine particles of suitable size and density. The number-average particle diameter of such fine particles is preferably 1 nm or more, and is preferably 30 nm or less, more preferably 20 nm or less, and further preferably 15 nm or less. The number-average particle diameter of the fine particles can be calculated by scanning electron microscope observation as an example. Specifically, the number-average particle diameter of the fine particles can be calculated by the method described in the EXAMPLES section of this specification. The number-average particle diameter of the fine particles can be adjusted by changing the catalyst metal equivalent thickness of the catalyst included in the composite layer. In terms of obtaining fine particles having the above-mentioned number-average particle diameter, the catalyst metal equivalent thickness is preferably 0.1 nm or more and 10 nm or less, and more preferably 0.3 nm or more and 3 nm or less. The catalyst metal equivalent thickness can be changed, for example, by changing the composition, concentration, or flow rate of the catalyst material gas or the time of the catalyst portion formation step. For example, the number-average particle diameter of the fine particles can be increased by increasing the concentration or flow rate of the catalyst material gas or increasing the time of the catalyst portion formation step. Conversely, the number-average particle diameter of the fine particles can be decreased by decreasing the concentration or flow rate of the catalyst material gas or decreasing the time of the catalyst portion formation step.

In the case where the catalyst portion is formed by the wet supporting method of (1) or sputtering of (2) mentioned above, the catalyst metal atoms contained in the formed catalyst portion oxidize when exposed to the air. However, upon being heated to the reaction temperature when used in the formation of fibrous carbon nanostructures in a reducing atmosphere, the catalyst metal atoms are reduced to metal. Further, the catalyst metal atoms diffuse and gather, and form fine particles. In the case where the catalyst portion is formed in a reducing atmosphere using the gasified catalyst material by the dry supporting method of (2), if the temperature at the time of formation is a predetermined temperature or more, the resultant catalyst portion has fine catalyst metal particles formed therein.

Although the equivalent thicknesses relating to the composite layer composed of the metal compound portion and the catalyst portion in layer form have been described in the foregoing paragraphs, the above-mentioned equivalent thicknesses may also apply to the below-mentioned composite layer having a mixed layer in which the metal compound and the catalyst coexist. Thus, the amount of the catalyst metal and the amount of the metal compound per one composite layer may be such that the equivalent thickness of the catalyst metal and the equivalent thickness of the metal compound calculated from the total amount of the catalyst metal and the total amount of the metal compound contained in the catalyst portion in layer form, the metal compound portion in layer form, and the mixed layer are in the above-mentioned ranges.

[Mixed Layer]

The mixed layer is a layer in which the catalyst metal derived from the catalyst material and the metal compound derived from the metal compound material coexist. In the mixed layer, the catalyst is supported firmly. Hence, the inclusion of the mixed layer in the supported catalyst can further improve the catalytic activity of the supported catalyst. The catalyst metal and the metal compound contained in the mixed layer may be the same as any of the components listed with regard to the catalyst portion and the metal compound portion. The mixed layer containing the catalyst metal and the metal compound can be, for example, formed by supplying the metal compound material together with the catalyst material in the formation of the composite layer. The catalyst supply ratio in this case is, for example, 50 vol % each, without being particularly limited thereto.

[Structure of Composite Layer]

The composite layer is not particularly limited, as long as it includes the catalyst portion containing the catalyst and the metal compound portion containing the metal compound. The composite layer may include at least one layer (in the case of the mixed layer) or two or more layers from among the "catalyst layer", the "metal compound layer", and the "mixed layer". The composite layer may have a covering layer on the layer structure of one or more layers stacked to include the catalyst portion and the metal compound portion. The "covering layer" is a layer different in property from the outermost surface of the composite layer, and covers at least part of the outermost surface. The covering layer may be made of the same component as any of the components listed with regard to the catalyst portion and the metal compound portion. For example, in the case where the composite layer is substantially composed of the metal compound layer and the catalyst layer, a structure in which the metal compound portion has a covering layer covering at least part of the catalyst portion at the outermost surface of the composite layer may be used. Such a structure is realized by, for example, stopping the supply of the catalyst material toward the end of the composite layer formation step and instead supplying the metal compound material. Such a structure of the composite layer suppresses aggregation of fine metal particles when forming fine metal particles in the composite layer, and improves the catalytic activity of the supported catalyst.

Moreover, for example, in the case where the outermost surface layer of the composite layer is the mixed layer, a structure in which at least part of the outermost surface of the mixed layer is covered with a covering layer containing the above-mentioned metal compound may be used. In this case, too, the catalyst is supported firmly, and the catalytic activity of the supported catalyst can be further improved. Such a structure is realized by, for example, supplying the catalyst material and the metal compound material together in the composite layer formation step and, toward the end of the composite layer formation step, stopping the supply of the catalyst material and supplying only the metal compound material. The supply ratio when supplying the catalyst material and the metal compound material together may be, for example, 50 vol % each, as mentioned above. The proportion of the time for supplying only the metal compound material in the composite layer formation step can be determined depending on the concentration, the flow rate, the catalyst material property, etc., and may be, for example, the same as the time of the mixed layer formation step.

<Structure of Supported Catalyst>

As described above, the supported catalyst is obtained by forming the composite layer laminate outside the support, and the composite layer laminate includes two or more composite layers. The supported catalyst preferably includes five or more composite layers. Such a supported catalyst has excellent catalytic activity.

The metal compound equivalent thickness of the whole metal compound in the supported catalyst is preferably more than 5 nm and more preferably more than 25 nm, and is typically 50 μm or less. If the total metal compound equivalent thickness of the metal compound in the supported catalyst is more than 5 nm, the catalytic activity of the supported catalyst can be further improved, and the production efficiency of fibrous carbon nanostructures can be further improved.

In the case where the supported catalyst includes a plurality of metal compound portions, the metal compound portions may be made of the same material or different materials. Preferably, the metal compound portions are made of the same material. In the case where the supported catalyst includes a plurality of metal compound layers, the metal compound equivalent thicknesses of the respective layers are preferably approximately the same, but may be different.

(Method of Producing Fibrous Carbon Nanostructures)

The presently disclosed method of producing fibrous carbon nanostructures includes: a step of synthesizing fibrous carbon nanostructures on the presently disclosed supported catalyst; and a peeling step of peeling the fibrous carbon nanostructures from the supported catalyst. With such a production method, high-quality fibrous carbon nanostructures can be produced with high efficiency. The presently disclosed production method preferably further includes a supported catalyst regeneration step of subjecting the supported catalyst after the peeling step to a supported catalyst regeneration process. By forming the composite layer again on the supported catalyst surface in the regeneration step, the catalytic activity of the supported catalyst can be further improved, and the production efficiency of fibrous carbon nanostructures can be further improved.

An example of the presently disclosed method of producing fibrous carbon nanostructures is roughly described below. The presently disclosed production method includes a peeling step of peeling the fibrous carbon nanostructures formed on the presently disclosed supported catalyst from the supported catalyst, as mentioned above. In addition to this step, the presently disclosed production method may include the following plurality of steps as an example, without being particularly limited thereto. The support, the metal compound material, and the catalyst material used in each of the following steps may be those described above. The presently disclosed production method can be realized using a typical catalyst production device and fibrous carbon nanostructure static bed synthesis device or fluidized bed synthesis device, without being particularly limited thereto. The use of a fluidized bed synthesis device is described below, as an example. Although the presently disclosed supported catalyst can be produced by the wet supporting method or the dry supporting method without being particularly limited thereto as mentioned above, the following describes the production by the dry supporting method as an example. Here, the metal compound material and the catalyst material may be those described above.

<Composite Layer Formation Step>

The presently disclosed production method may include a composite layer formation step of forming the composite layer outside the support. In the composite layer formation step, for example, the metal compound material in a gaseous state, oxygen element-containing gas such as oxygen, and inactive gas such as nitrogen are supplied to a catalyst production device heated to the reaction temperature, to form the metal compound portion. The oxygen element-containing gas is, for example, air, oxygen, water vapor, and/or carbon dioxide. The inactive gas is not limited to nitrogen, and may be noble gas such as argon gas without being particularly limited thereto. The same oxygen element-containing gas and inactive gas may be used in the following steps.

In the composite layer formation step, for example, the catalyst material in a gaseous state, oxygen element-containing gas and/or reducing gas, and inactive gas are supplied to the catalyst preparation device heated to the reaction temperature to bring them into contact with the metal compound portion, to form the catalyst portion on the supported catalyst.

<Fibrous Carbon Nanostructure Synthesis Step>

The presently disclosed production method may include a fibrous carbon nanostructure synthesis step of synthesizing fibrous carbon nanostructures on the supported catalyst. In the fibrous carbon nanostructure synthesis step, for example, a fluidized bed is formed with the supported catalyst to synthesize the fibrous carbon nanostructures. An example of the procedure is described below. In the fibrous carbon nanostructure synthesis step, first, a fibrous carbon nanostructure fluidized bed synthesis device is filled with the supported catalyst obtained through the above-mentioned composite layer formation step, and the inside of the fluidized bed synthesis device is set to an atmosphere of reducing gas such as hydrogen and inactive gas, and heated to the reaction temperature to create a heating atmosphere, thus reducing the catalyst supported by the supported catalyst. Carbon material gas containing a carbon material and inactive gas is then supplied into the fluidized bed synthesis device. The carbon material may be a carbon material containing one or more selected from the group consisting of alkyne and alkene (olefin hydrocarbon), alkane (paraffin hydrocarbon), alcohol, ether, aldehyde, ketone, aromatic series, and carbon monoxide, without being particularly limited thereto. The carbon material may be supplied into the reactor in a gaseous state. Alternatively, the carbon material in a liquid or solid state at room temperature may be supplied into the fluidized bed synthesis device to evaporate the carbon material by heat of the heating atmosphere in the fluidized bed synthesis device. The carbon material gas may contain reducing gas and/or oxygen element-containing gas in addition to the carbon material and inactive gas, without being particularly limited thereto.

The pressure of the supply of the carbon material gas is not particularly limited, and may be, for example, 0.001 MPa or more and 1.500 MPa or less. The time required for the step, the carbon material concentration in the supplied carbon material gas, etc. can be appropriately set depending on desired fibrous nanostructure property and production efficiency. For example, the length of fibrous carbon nanostructures can be increased by increasing the time of the synthesis step, and the production efficiency can be improved by increasing the carbon material concentration in the carbon material gas.

(Fibrous Carbon Nanostructures)

The fibrous carbon nanostructures formed on the supported catalyst in the synthesis step are present in the fluidized bed in a state of, for example, extending radially from the surface of the supported catalyst or peeled away from the supported catalyst due to contact with another supported catalyst in the fluidized bed or static bed. The diameter of the fibrous carbon nanostructures obtained in the synthesis step is preferably 0.4 nm or more and 20 nm or less. The average length of the fibrous carbon nanostructures at the time of synthesis is preferably 50 μm or more and 5000 μm or less. Fibrous carbon nanostructures that are longer at the time of synthesis are more susceptible to damage such as breaking and severing at the time of dispersion. Therefore, it is preferable that the average length of the structures at the time of synthesis is 5000 μm or less. In the case where the obtained fibrous carbon nanostructures include CNTs, the number of walls of the CNTs is preferably 1 or more and 10 or less.

<Transport Step>

The presently disclosed production method preferably includes a transport step of transporting the supported catalyst having the fibrous carbon nanostructures on its surface into a separator for performing the below-mentioned peeling step. For example, the transport step may generate airflow in the fluidized bed synthesis device to transport the supported catalyst having the fibrous carbon nanostructures on its surface by the airflow, without being particularly limited thereto.

<Peeling Step>

The presently disclosed production method includes a peeling step of peeling the fibrous carbon nanostructures formed on the supported catalyst from the supported catalyst. For example, the peeling step may be performed by separating the fibrous carbon nanostructures from the supported catalyst by stirring in liquid and collecting the fibrous carbon nanostructures dispersed in liquid, without being particularly limited thereto. Alternatively, the peeling step may be performed by shaking the supported catalyst having the fibrous carbon nanostructures on its surface so that the fibrous carbon nanostructures are shaken off the supported catalyst, and collecting the fibrous carbon nanostructures by a known method such as sieving.

<Supported Catalyst Regeneration Step>

The presently disclosed production method preferably includes a supported catalyst regeneration step. The supported catalyst regeneration step preferably includes: a step of oxidizing the surface of the supported catalyst to obtain a reusable supported catalyst; and a catalyst resupporting step of forming the composite layer including the metal compound portion and the catalyst portion on the surface of the reusable supported catalyst. Since the supported catalyst after the synthesis step has residual carbon components attached to its surface, it is preferable to remove the residual carbon components before further forming the composite layer in the regeneration step. Accordingly, for example, the supported catalyst is burned in the presence of oxygen element-containing gas, to oxidize the surface of the supported catalyst. The residual carbon components remaining on the supported catalyst surface can be removed in this way. Alternatively, the residual carbon components on the supported catalyst surface may be removed by stirring, in liquid, the supported catalyst from which the fibrous carbon nanostructures have been peeled.

Catalyst resupporting may then be performed in the same way as the above-mentioned composite layer formation step. By reusing the supported catalyst used for the synthesis of fibrous carbon nanostructures, the production cost of fibrous carbon nanostructures can be reduced. Moreover, by performing the above-mentioned step of oxidizing the surface of the supported catalyst to obtain the reusable supported catalyst in the regeneration step intended for reuse, the multilayer structure of the supported catalyst obtained by stacking a plurality of composite layers can be formed favorably. Thus, the catalytic activity of the supported catalyst can be further improved to further improve the production efficiency and quality of fibrous carbon nanostructures. Since the fibrous carbon nanostructures can be easily peeled from such a supported catalyst having a multilayer structure, the yield of fibrous carbon nanostructures can be further improved to further improve the production efficiency of fibrous carbon nanostructures.

(Supported Catalyst with Fibrous Carbon Nanostructures)

The presently disclosed supported catalyst may have fibrous carbon nanostructures on its surface. More specifically, the presently disclosed supported catalyst may have fibrous carbon nanostructures formed thereon. Such a supported catalyst may be included in fibrous carbon nanostructures produced and collected using the presently disclosed production method. In other words, such a supported catalyst may be a supported catalyst that has not been peeled from the fibrous carbon nanostructures in the peeling step and has been collected together with the fibrous carbon nanostructures in the collection step.

EXAMPLES

The following provides a more specific description of the present disclosure based on examples, although the present disclosure in not limited to the following examples. In the following description, "%" and "parts" used in expressing quantities are by mass, unless otherwise specified.

In the examples and comparative examples, the fracture resistance and use adequacy of the supported catalyst, the metal compound equivalent thickness of the metal compound, the catalyst metal equivalent thickness of the catalyst, the yield amount of the obtained carbon nanotubes, and the success or failure of CNT synthesis were measured or evaluated as follows.

<Fracture Resistance of Supported Catalyst>

Regarding the fracture resistance of the supported catalyst, supported catalysts each obtained by repeatedly performing the composite layer formation step five times were observed by SEM, and whether or not the supported catalyst surface was defective was visually determined for ten supported catalysts, to perform evaluation according to the following criteria. If the supported catalyst has excellent fracture resistance, the reuse adequacy of the supported catalyst is high, which contributes to improved quality of the resultant fibrous carbon nanostructures.

A: Not defective.

B: Defective.

<Use Adequacy of Supported Catalyst>

Regarding the use adequacy of the supported catalyst, the tube walls of the fluidized bed synthesis device were visually observed, and whether or not cloudiness resulting from damage to the tube walls made of transparent quartz glass occurred was evaluated according to the following criteria.

A: Not cloudy.

B: Cloudy.

<Equivalent Thickness>

Characteristic X-ray intensity was measured for the supported catalyst using an energy dispersive X-ray spectrometer (produced by AMETEK, Inc., EDAX Genesis) included with a scanning electron microscope (produced by Hitachi High-Technologies Corporation, S-4800), and the obtained characteristic X-ray intensity measurement value was compared with a calibration curve obtained using an Al standard film/Fe standard film beforehand, to measure each equivalent thickness. The Al standard film was used for the metal compound equivalent thickness of the metal compound, and the Fe standard film was used for the catalyst metal equivalent thickness of the catalyst.

<Yield Amount of Carbon Nanotubes>

Gas exhausted from the CNT synthesis fluidized bed device during CNT synthesis was analyzed by a gas chromatograph (produced by Shimadzu Corporation, GC-2014) including a hydrogen flame ionizing type detector. The mass of the carbon-containing component in the exhaust gas was calculated from the analysis value, and the calculated value was subtracted from the mass ($C_S$) of the carbon material introduced into the CNT synthesis fluidized bed device upon CNT synthesis, to calculate the mass ($C_{CNT,gas}$) of the carbon material considered to have converted to CNTs. For the obtained value, ($C_{CNT,gas}/C_S$)×100 was calculated to find the carbon material conversion rate (mol %). Further, the mass change of the supported catalyst between before and after the CNT synthesis was measured by an electronic balance (produced by Shimadzu Corporation, model:

AUW120D), the mass ($C_{CNT,powder}$) of the CNTs was obtained, and ($C_{CNT,powder}/C_S$)×100 was calculated to find the yield of the CNTs.

<Success or Failure of CNT Synthesis>

The success or failure of CNT synthesis was evaluated according to the following criteria, by conducting scanning electron microscope observation on the supported catalyst that had undergone the CNT synthesis.

A: CNTs grew approximately uniformly over the entire surface of the supported catalyst.

B: CNT growth was very little or was not noticeable.

Example 1

<Production of Supported Catalyst>
[Preparation Step]

A mullite powder (produced by Itochu Ceratech Corporation, "NAIGAI CERABEADS 60", #750) with a volume-average particle diameter (D50) of about 150 μm was used as a support. A fluidized bed device formed by a glass tube was filled with 70 g of the mullite powder and, while causing gas containing 4 vol % of oxygen and 96 vol % of nitrogen to flow at 3 slm, heated to 800° C. at a rate of 40° C./min and held for 2 min.

[Composite Layer Formation Step]

Next, vapors of aluminum isopropoxide (produced by Wako Pure Chemical Industries, Ltd., "012-16012", chemical formula: $Al(O-i-Pr)_3$ [i-Pr is isopropyl group-$CH(CH_3)_2$]) as a metal compound material accompanied by $N_2$ gas of 0.5 slm at 130° C. were supplied for 5 min together with gas of 4 vol % of oxygen and 96 vol % of nitrogen at 10 slm, to form an aluminum oxide layer (aluminum oxide equivalent thickness: 5 nm) as a metal compound portion on the mullite powder as a support.

Next, vapors of ferrocene (produced by Wako Pure Chemical Industries, Ltd., "060-05981") as a catalyst material accompanied by $N_2$ gas of 0.02 slm at 130° C. were supplied for 5 min together with gas of 4 vol % of oxygen and 96 vol % of nitrogen at 10 slm, to form a catalyst layer (iron equivalent thickness: 0.5 nm) containing fine particles made of Fe.

[Repetition Step]

For the supported catalyst in which the composite layer had been formed, the composite layer formation step was further repeated four times, thus producing a supported catalyst including five composite layers.

The resultant supported catalyst was evaluated according to the above-mentioned methods. The results are listed in Table 1. The specific surface area of the supported catalyst was measured by a BET method, and determined to be less than 1 m$^2$/g.

<Synthesis of CNTs>

A carbon nanotube synthesis fluidized bed device formed by a glass tube with a tube internal diameter of 2.2 cm was filled with the supported catalyst to a layer height of 3 cm. While causing gas containing 10 vol % of hydrogen and 90 vol % of nitrogen to flow at 2 slm, the inside of the CNT synthesis fluidized bed device was heated to 800° C., and held for 10 min to reduce the supported catalyst. Subsequently, gas containing 0.7 vol % of acetylene ($C_2H_2$) as a carbon material, 10 vol % of hydrogen, 3 vol % of carbon dioxide, and 86.3 vol % of nitrogen was supplied into the CNT synthesis fluidized bed device at 2 slm for 10 min, to synthesize CNTs. The resultant CNTs were measured and evaluated according to the above-mentioned methods. The results are listed in Table 1. FIG. 1 illustrates a SEM image of the supported catalyst having CNTs on its surface according to Example 1. As illustrated in FIG. 1, CNTs grew on the entire surfaces of the supported catalyst particles.

Example 2-1

The same conditions as in Example 1 were applied except that the CNT synthesis temperature was changed to 725° C. and the amount of carbon material-containing gas supplied into the CNT synthesis fluidized bed device was changed to 3 slm. The resultant CNTs were evaluated in the same way as in Example 1. The results are listed in Table 1.

Example 2-2

The same conditions as in Example 1 were applied except that the CNT synthesis temperature was changed to 750° C. and the amount of carbon material-containing gas supplied into the CNT synthesis fluidized bed device was changed to 3 slm. The resultant CNTs were evaluated in the same way as in Example 1. The results are listed in Table 1.

Example 3-1

The synthesis of CNTs using the same supported catalyst as in Example 1 was performed in the same way as in Example 1, except that the CNT synthesis temperature was changed to 730° C. and the amount of gas supplied into the CNT synthesis fluidized bed device was changed to 3 slm. Each measurement and evaluation were conducted in the same way as in Example 1. The results are listed in Table 1.

Example 3-2

The composite layer formation step was performed to obtain a supported catalyst in the same way as in Example 1, except that the flow rate of $N_2$ gas accompanying ferrocene as a catalyst material was changed to 0.03 slm and the iron equivalent thickness of the catalyst layer was changed to 0.75 nm. The synthesis of CNTs using the obtained supported catalyst was then performed in the same way as in Example 1, except that the CNT synthesis temperature was changed to 730° C. and the amount of gas supplied into the CNT synthesis fluidized bed device was changed to 3 slm. Each measurement and evaluation were conducted in the same way as in Example 1. The results are listed in Table 1.

Example 3-3

The composite layer formation step was performed to obtain a supported catalyst in the same way as in Example 1, except that the flow rate of $N_2$ gas accompanying ferrocene as a catalyst material was changed to 0.04 slm and the iron equivalent thickness of the catalyst layer was changed to 1 nm. The synthesis of CNTs using the obtained supported catalyst was then performed in the same way as in Example 1, except that the CNT synthesis temperature was changed to 730° C. and the amount of gas supplied into the CNT synthesis fluidized bed device was changed to 3 slm. Each measurement and evaluation were conducted in the same way as in Example 1. The results are listed in Table 1.

Example 4

A supported catalyst was obtained in the same way as in Example 1, except that the iron equivalent thickness of the catalyst layer was changed to 1 nm. The synthesis of CNTs using the obtained supported catalyst was then performed in the same way as in Example 1, except that the CNT synthesis temperature was changed to 725° C. and the gas supplied into the CNT synthesis fluidized bed device was changed to 1.5 slm of gas containing 10 vol % of ethylene ($C_2H_4$) as a carbon material, 10 vol % of hydrogen, 3 vol % of carbon dioxide, and 77 vol % of nitrogen. Each measurement and evaluation were conducted in the same way as in Example 1. The results are listed in Table 1. The specific surface area of the supported catalyst was measured by a BET method, and determined to be less than 1 $m^2/g$.

Example 5-1

A supported catalyst was obtained under the same conditions as in Example 4. The synthesis of CNTs using the obtained supported catalyst was performed in the same way as in Example 4, except that the temperature was changed to 800° C. Each measurement and evaluation were conducted in the same way as in Example 1. The results are listed in Table 1.

Example 5-2

A supported catalyst was obtained under the same conditions as in Example 4. The synthesis of CNTs using the obtained supported catalyst was performed in the same way as in Example 4, except that the temperature was changed to 800° C. and the supported catalyst was filled to a layer height of 6 cm. Each measurement and evaluation were conducted in the same way as in Example 1. The results are listed in Table 1.

Example 5-3

A supported catalyst was obtained under the same conditions as in Example 4. The synthesis of CNTs using the obtained supported catalyst was performed in the same way as in Example 4, except that the temperature was changed to 800° C. and the supported catalyst was filled to a layer height of 9 cm. Each measurement and evaluation were conducted in the same way as in Example 1. The results are listed in Table 1.

Example 6-1

A supported catalyst was produced in the same way as in Example 1, except that the iron equivalent thickness of the catalyst layer was changed to 1 nm. A carbon nanotube synthesis static bed device including a horizontal furnace was filled with the obtained supported catalyst, and gas containing 0.3 vol % of acetylene ($C_2H_2$) as a carbon material, 10 vol % of hydrogen, 3 vol % of carbon dioxide, and 86.7 vol % of argon was supplied into the CNT synthesis static bed device at 0.5 slm for 10 min, to synthesize CNTs. The resultant CNTs were evaluated in the same way as in Example 1. The results are listed in Table 1.

Example 6-2

A supported catalyst was produced in the same way as in Example 1, except that the iron equivalent thickness of the catalyst layer was changed to 1 nm and ten composite layers were formed. CNTs were synthesized in the same way as in Example 6-1, using the obtained supported catalyst. Each evaluation was conducted in the same way as in Example 1. The results are listed in Table 1. The specific surface area of the obtained supported catalyst was measured by a BET method, and determined to be less than 1 $m^2/g$.

Example 6-3

A supported catalyst was produced in the same way as in Example 1, except that the iron equivalent thickness of the catalyst layer was changed to 1 nm and 20 composite layers were formed. CNTs were synthesized in the same way as in Example 6-1, using the obtained supported catalyst. Each evaluation was conducted in the same way as in Example 1. The results are listed in Table 1. The specific surface area of the obtained supported catalyst was measured by a BET method, and determined to be less than 1 $m^2/g$.

Examples 7-1-1 to 7-1-3

A supported catalyst was produced in the same way as in Example 1, except that the iron equivalent thickness of the catalyst layer was changed to 1 nm. A carbon nanotube synthesis static bed device including a horizontal furnace was filled with the obtained supported catalyst, and gas containing 0.3 vol % of acetylene ($C_2H_2$) as a carbon material, 10 vol % of hydrogen, 3 vol % of carbon dioxide, and 86.7 vol % of argon was supplied into the CNT synthesis static bed device at 0.5 slm for 10 min, to synthesize CNTs at 700° C. (Example 7-1-1), 750° C. (Example 7-1-2), and 800° C. (Example 7-1-3). Each evaluation was conducted in the same way as in Example 1. The results are listed in Table 2.

Examples 7-2-1 to 7-2-3

A supported catalyst was produced in the same way as in Example 1, except that the iron equivalent thickness of the catalyst layer was changed to 1 nm and the aluminum oxide equivalent thickness of the metal compound layer was changed to 10 nm. A carbon nanotube synthesis static bed device including a horizontal furnace was filled with the obtained supported catalyst, and gas containing 0.3 vol % of acetylene ($C_2H_2$) as a carbon material, 10 vol % of hydrogen, 3 vol % of carbon dioxide, and 86.7 vol % of argon was supplied into the CNT synthesis static bed device at 0.5 slm for 10 min, to synthesize CNTs at 700° C. (Example 7-2-1), 750° C. (Example 7-2-2), and 800° C. (Example 7-2-3). Each evaluation was conducted in the same way as in Example 1. The results are listed in Table 2. The specific surface area of the obtained supported catalyst was measured by a BET method, and determined to be less than 1 $m^2/g$.

Figure 2:
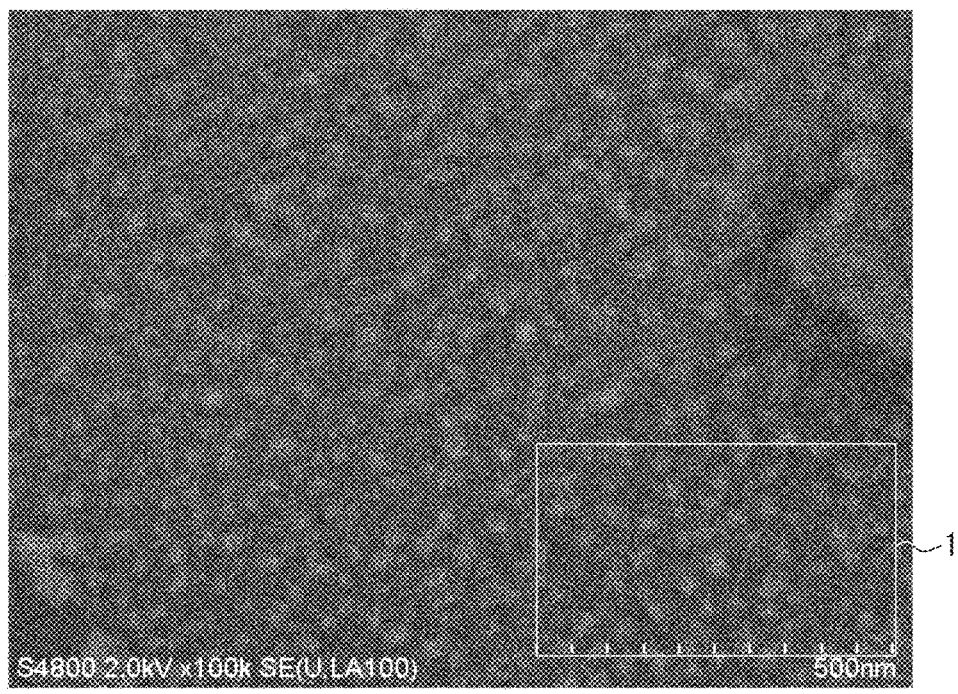
FIG. 2 is a SEM image of a supported catalyst surface before CNT synthesis.

The surface of the supported catalyst according to each of Examples (7-2-1) to (7-2-3) before CNT synthesis was observed by a scanning electron microscope (produced by Hitachi High-Technologies Corporation, S-4800) in a reflection electron mode with an acceleration voltage of 2 kV. FIG. 2 illustrates the results. In FIG. 2, portions with relatively high luminance are Fe fine particles. As illustrated in FIG. 2, Fe fine particles formed uniformly on mullite particle surfaces. 79 Fe fine particles were present in a range 1 of 300 nm×500 nm, and the number density of Fe fine particles was 527 particles/$\mu m^2$. The average thickness (iron equivalent thickness) of Fe fine particles was 1 nm, and the total volume of Fe fine particles in a range of 300 nm×500 nm was $1.5 \times 10^4$ $nm^3$. The average volume per one Fe fine particle was $1.5 \times 10^5$ $nm^3/79 = 1.9 \times 10^3$ $nm^3$, and the sphere equivalent diameter (the diameter of a sphere having the same volume) was 15 nm.

Example 8-1

A supported catalyst was produced in the same way as in Example 1, except that vapors of aluminum isopropoxide as a metal compound material accompanied by $N_2$ gas of 1.1 slm at 140° C. were supplied for 5 min to form $Al_2O_3$ as a metal compound portion with an aluminum oxide equivalent thickness of 20 nm, and then vapors of ferrocene as a catalyst material accompanied by $N_2$ gas of 0.06 slm at 140° C. were supplied for 2 min to form Fe as a catalyst layer with an iron equivalent thickness of 1 nm. CNTs were synthesized in the same way as in Example 6-1, using the obtained supported catalyst. Each evaluation was conducted in the same way as in Example 1. The results are listed in Table 2. The specific surface area of the obtained supported catalyst was measured by a BET method, and determined to be less than 1 $m^2/g$.

Example 8-2

A supported catalyst was produced in the same way as in Example 1, except that vapors of aluminum isopropoxide as a metal compound material accompanied by $N_2$ gas of 1.1 slm at 140° C. were supplied for 5 min to form $Al_2O_3$ as a metal compound portion with an aluminum oxide equivalent thickness of 20 nm, and then vapors of ferrocene as a catalyst material accompanied by $N_2$ gas of 0.06 slm at 140° C. and vapors of aluminum isopropoxide as a metal compound material accompanied by $N_2$ gas of 0.07 slm at 140° C. were simultaneously supplied for 2 min to form a mixed layer having Fe with an iron equivalent thickness of 1 nm and $Al_2O_3$ with an aluminum oxide equivalent thickness of 0.5 nm. The specific surface area of the obtained supported catalyst was measured by a BET method, and determined to be less than 1 $m^2/g$.

CNTs were synthesized in the same way as in Example 6-1, using the obtained supported catalyst. Each evaluation was conducted in the same way as in Example 1. The results are listed in Table 2.

Example 8-3

A supported catalyst was produced in the same way as in Example 1, except that vapors of aluminum isopropoxide as a metal compound material accompanied by $N_2$ gas of 1.1 slm at 140° C. were supplied for 5 min to form $Al_2O_3$ as a metal compound portion with an aluminum oxide equivalent thickness of 20 nm, then vapors of ferrocene as a catalyst material accompanied by $N_2$ gas of 0.06 slm at 140° C. were supplied for 2 min to form Fe as a catalyst layer with an iron equivalent thickness of 1 nm, and then vapors of aluminum isopropoxide as a metal compound material accompanied by $N_2$ gas of 0.07 slm at 140° C. were supplied for 2 min to form $Al_2O_3$ as a metal compound layer with an aluminum oxide equivalent thickness of 0.5 nm. The specific surface area of the obtained supported catalyst was measured by a BET method, and determined to be less than 1 $m^2/g$.

CNTs were synthesized in the same way as in Example 6-1, using the obtained supported catalyst. Each evaluation was conducted in the same way as in Example 1. The results are listed in Table 2.

Example 8-4

A supported catalyst was produced in the same way as in Example 1, except that vapors of aluminum isopropoxide as a metal compound material accompanied by $N_2$ gas of 1.1 slm at 140° C. were supplied for 5 min to form $Al_2O_3$ as a metal compound layer with an aluminum oxide equivalent thickness of 20 nm, then vapors of ferrocene as a catalyst material accompanied by $N_2$ gas of 0.06 slm at 140° C. and vapors of aluminum isopropoxide as a metal compound material accompanied by $N_2$ gas of 0.07 slm at 140° C. were simultaneously supplied for 2 min to form a mixed layer having Fe with an iron equivalent thickness of 1 nm and $Al_2O_3$ with an aluminum oxide equivalent thickness of 0.5 nm, and then vapors of aluminum isopropoxide as a metal compound material accompanied by $N_2$ gas of 0.07 slm at 140° C. were supplied for 2 min to form $Al_2O_3$ as a metal compound portion with an aluminum oxide equivalent thickness of 0.5 nm. The specific surface area of the obtained supported catalyst was measured by a BET method, and determined to be less than 1 $m^2/g$.

CNTs were synthesized in the same way as in Example 6-1, using the obtained supported catalyst. Each evaluation was conducted in the same way as in Example 1. The results are listed in Table 2.

Comparative Example 1

Figure 3:
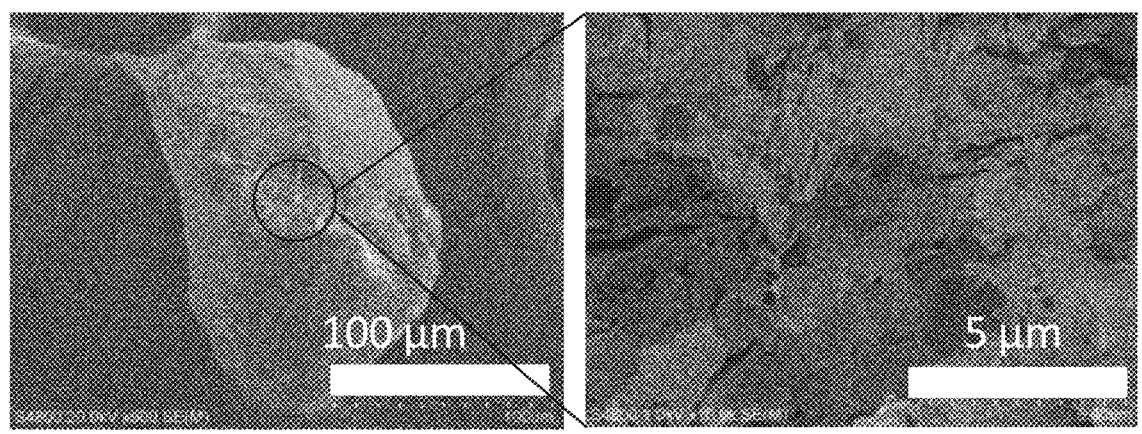
FIG. 3 is a SEM image of a supported catalyst formed using silica sand as a support.

A supported catalyst was produced in the same way as in Example 1, except that, in the supported catalyst production, silica sand (produced by Mikawakeiseki Co., Ltd., Mikawa silica sand No. R8) with a volume-average particle diameter of about 100 μm was used instead of mullite. Subsequently, gas containing 1 vol % of acetylene ($C_2H_2$) as a carbon material, 10 vol % of hydrogen, 3 vol % of carbon dioxide, and 86 vol % of nitrogen was supplied into the CNT synthesis fluidized bed device at 2 slm for 20 min, to synthesize CNTs. The resultant supported catalyst was evaluated in the same way as in Example 1. The results are listed in Table 2. CNTs could not be synthesized sufficiently. To examine the cause, a particle structure after causing only $N_2$ gas to flow through silica sand to induce fluidization was observed. FIG. 3 illustrates a SEM image. As is clear from an enlarged view on the right side of FIG. 3, silica sand was fractured in the fluidized bed device used for supported catalyst production.

Comparative Example 2

Supported catalyst production was attempted in the same way as in Example 1, except that, in the supported catalyst production, alumina beads (produced by Fuji Manufacturing Co., Ltd., white alundum #120) with a volume-average particle diameter of about 100 μm were used instead of mullite. However, as the number of times the repetition step was performed increased, the tube walls of the fluidized bed device formed by a quartz glass tube became cloudy, and accordingly the experiment was discontinued. Thus, a supported catalyst of a multilayer structure could not be formed, and CNTs could not be synthesized.

Comparative Example 3

A supported catalyst was produced in the same way as in Example 1, except that the iron equivalent thickness of Fe as a catalyst layer was changed to 1 nm and one composite layer was formed. The obtained supported catalyst was evaluated in the same way as in Example 1. The results are listed in Table 2.

Further, a carbon nanotube synthesis device including a horizontal furnace was filled with the obtained supported catalyst, and gas containing 0.3 vol % of acetylene ($C_2H_2$) as a carbon material, 10 vol % of hydrogen, 3 vol % of carbon dioxide, and 86.7 vol % of argon was supplied into the CNT synthesis device at 0.5 slm for 10 min, to synthesize CNTs. The resultant CNTs were evaluated in the same way as in Example 1. The results are listed in Table 2.

In the tables, "FCVD" denotes fluidized bed CVD, "SCVD" denotes static bed CVD, and "CNT" denotes carbon nanotubes.

TABLE 1

| | | | | | | Example | | | | |
|---|---|---|---|---|---|---|---|---|---|---|
| | | | | 1 | 2-1 | 2-2 | 3-1 | 3-2 | 3-3 | 4 |
| Supported catalyst | Support | | Material | Mullite | Mullite | Mullite | Mullite | Mullite | Mullite | Mullite |
| | | | Particle diameter [μm] | 150 | 150 | 150 | 150 | 150 | 150 | 150 |
| | | | Al content [mass %] | 32.3 | 32.3 | 32.3 | 32.3 | 32.3 | 32.3 | 32.3 |
| | | | Si content [mass %] | 16.8 | 16.8 | 16.8 | 16.8 | 16.8 | 16.8 | 16.8 |
| | Composite layer | Metal compound layer | Composition | $Al_2O_3$ | $Al_2O_3$ | $Al_2O_3$ | $Al_2O_3$ | $Al_2O_3$ | $Al_2O_3$ | $Al_2O_3$ |
| | | | Al content [mass %] | 52.9 | 52.9 | 52.9 | 52.9 | 52.9 | 52.9 | 52.9 |
| | | | Equivalent thickness [nm] | 5 | 5 | 5 | 5 | 5 | 5 | 5 |
| | | Catalyst layer | Composition | Fe | Fe | Fe | Fe | Fe | Fe | Fe |
| | | | Equivalent thickness [nm] | 0.5 | 0.5 | 0.5 | 0.5 | 0.75 | 1 | 1 |
| | | Mixed layer | Metal compound portion Composition | — | — | — | — | — | — | — |
| | | | Al content [mass %] | — | — | — | — | — | — | — |
| | | | Equivalent thickness [nm] | — | — | — | — | — | — | — |
| | | | Catalyst portion Composition | — | — | — | — | — | — | — |
| | | | Equivalent thickness [nm] | — | — | — | — | — | — | — |
| | | Covering layer | Composition | — | — | — | — | — | — | — |
| | | | Al content [mass %] | — | — | — | — | — | — | — |
| | | | Equivalent thickness [nm] | — | — | — | — | — | — | — |
| | | | Number of layers repeated | 5 | 5 | 5 | 5 | 5 | 5 | 5 |
| CNT | | | Synthesis method | FCVD | FCVD | FCVD | FCVD | FCVD | FCVD | FCVD |
| | | | Layer height [cm] | 3 | 3 | 3 | 3 | 3 | 3 | 3 |
| | | | Synthesis temperature [° C.] | 800 | 725 | 750 | 730 | 730 | 730 | 725 |
| | | | Carbon material | $C_2H_2$ | $C_2H_2$ | $C_2H_2$ | $C_2H_2$ | $C_2H_2$ | $C_2H_2$ | $C_2H_4$ |
| | | | Carbon material gas flow rate [slm] | 2 | 3 | 3 | 3 | 3 | 3 | 1.5 |
| | | | Carbon material conversion rate [mol %] | 98 | 60 | 50 | 40 | 80 | 90 | 7.7 |
| | | | CNT yield [mass %] | 73 | 22 | 22 | 22 | 49 | 53 | 5 |
| | | | Success or failure of CNT synthesis | A | A | A | A | A | A | A |
| Evaluation | | | Fracture resistance | A | A | A | A | A | A | A |
| | | | Use adequacy | A | A | A | A | A | A | A |

| | | | | Example | | | | | |
|---|---|---|---|---|---|---|---|---|---|
| | | | | 5-1 | 5-2 | 5-3 | 6-1 | 6-2 | 6-3 |
| Supported catalyst | Support | | Material | Mullite | Mullite | Mullite | Mullite | Mullite | Mullite |
| | | | Particle diameter [μm] | 150 | 150 | 150 | 150 | 150 | 150 |
| | | | Al content [mass %] | 32.3 | 32.3 | 32.3 | 32.3 | 32.3 | 32.3 |
| | | | Si content [mass %] | 16.8 | 16.8 | 16.8 | 16.8 | 16.8 | 16.8 |
| | Composite layer | Metal compound layer | Composition | $Al_2O_3$ | $Al_2O_3$ | $Al_2O_3$ | $Al_2O_3$ | $Al_2O_3$ | $Al_2O_3$ |
| | | | Al content [mass %] | 52.9 | 52.9 | 52.9 | 52.9 | 52.9 | 52.9 |
| | | | Equivalent thickness [nm] | 5 | 5 | 5 | 5 | 5 | 5 |
| | | Catalyst layer | Composition | Fe | Fe | Fe | Fe | Fe | Fe |
| | | | Equivalent thickness [nm] | 1 | 1 | 1 | 1 | 1 | 1 |
| | | Mixed layer | Metal compound portion Composition | — | — | — | — | — | — |
| | | | Al content [mass %] | — | — | — | — | — | — |
| | | | Equivalent thickness [nm] | — | — | — | — | — | — |
| | | | Catalyst portion Composition | — | — | — | — | — | — |
| | | | Equivalent thickness [nm] | — | — | — | — | — | — |
| | | Covering layer | Composition | — | — | — | — | — | — |
| | | | Al content [mass %] | — | — | — | — | — | — |
| | | | Equivalent thickness [nm] | — | — | — | — | — | — |
| | | | Number of layers repeated | 5 | 5 | 5 | 5 | 10 | 20 |
| CNT | | | Synthesis method | FCVD | FCVD | FCVD | SCVD | SCVD | SCVD |
| | | | Layer height [cm] | 3 | 6 | 9 | — | — | — |
| | | | Synthesis temperature [° C.] | 800 | 800 | 800 | 800 | 800 | 800 |
| | | | Carbon material | $C_2H_4$ | $C_2H_4$ | $C_2H_4$ | $C_2H_2$ | $C_2H_2$ | $C_2H_2$ |
| | | | Carbon material gas flow rate [slm] | 1.5 | 1.5 | 1.5 | 0.5 | 0.5 | 0.5 |
| | | | Carbon material conversion rate [mol %] | 10 | 20 | 33 | — | — | — |
| | | | CNT yield [mass %] | 6.3 | 11 | 26 | — | — | — |
| | | | Success or failure of CNT synthesis | A | A | A | A | A | A |
| Evaluation | | | Fracture resistance | A | A | A | A | A | A |
| | | | Use adequacy | A | A | A | A | A | A |

TABLE 2

|  |  |  |  | Example | | | | | | |
|---|---|---|---|---|---|---|---|---|---|---|
|  |  |  |  | 7-1-1 | 7-1-2 | 7-1-3 | 7-2-1 | 7-2-2 | 7-2-3 | 8-1 |
| Supported catalyst | Support |  | Material | Mullite | Mullite | Mullite | Mullite | Mullite | Mullite | Mullite |
|  |  |  | Particle diameter [μm] | 150 | 150 | 150 | 150 | 150 | 150 | 150 |
|  |  |  | Al content [mass %] | 32.3 | 32.3 | 32.3 | 32.3 | 32.3 | 32.3 | 32.3 |
|  |  |  | Si content [mass %] | 16.8 | 16.8 | 16.8 | 16.8 | 16.8 | 16.8 | 16.8 |
|  | Composite layer | Metal compound layer | Composition | $Al_2O_3$ | $Al_2O_3$ | $Al_2O_3$ | $Al_2O_3$ | $Al_2O_3$ | $Al_2O_3$ | $Al_2O_3$ |
|  |  |  | Al content [mass %] | 52.9 | 52.9 | 52.9 | 52.9 | 52.9 | 52.9 | 52.9 |
|  |  |  | Equivalent thickness [nm] | 5 | 5 | 5 | 10 | 10 | 10 | 20 |
|  |  | Catalyst layer | Composition | Fe | Fe | Fe | Fe | Fe | Fe | Fe |
|  |  |  | Equivalent thickness [nm] | 1 | 1 | 1 | 1 | 1 | 1 | 1 |
|  |  | Mixed layer | Metal compound portion Composition | — | — | — | — | — | — | — |
|  |  |  | Al content [mass %] | — | — | — | — | — | — | — |
|  |  |  | Equivalent thickness [nm] | — | — | — | — | — | — | — |
|  |  |  | Catalyst portion Composition | — | — | — | — | — | — | — |
|  |  |  | Equivalent thickness [nm] | — | — | — | — | — | — | — |
|  |  | Covering layer | Composition | — | — | — | — | — | — | — |
|  |  |  | Al content [mass %] | — | — | — | — | — | — | — |
|  |  |  | Equivalent thickness [nm] | — | — | — | — | — | — | — |
|  |  |  | Number of layers repeated | 5 | 5 | 5 | 5 | 5 | 5 | 5 |
| CNT |  |  | Synthesis method | SCVD | SCVD | SCVD | SCVD | SCVD | SCVD | SCVD |
|  |  |  | Layer height [cm] | — | — | — | — | — | — | — |
|  |  |  | Synthesis temperature [° C.] | 700 | 750 | 800 | 700 | 750 | 800 | 800 |
|  |  |  | Carbon material | $C_2H_2$ | $C_2H_2$ | $C_2H_2$ | $C_2H_2$ | $C_2H_2$ | $C_2H_2$ | $C_2H_2$ |
|  |  |  | Carbon material gas flow rate [slm] | 0.5 | 0.5 | 0.5 | 0.5 | 0.5 | 0.5 | 0.5 |
|  |  |  | Carbon material conversion rate [mol %] | — | — | — | — | — | — | — |
|  |  |  | CNT yield [mass %] | — | — | — | — | — | — | — |
|  |  |  | Success or failure of CNT synthesis | A | A | A | A | A | A | A |
| Evaluation |  |  | Fracture resistance | A | A | A | A | A | A | A |
|  |  |  | Use adequacy | A | A | A | A | A | A | A |

|  |  |  |  | Example | | | Comparative Example | | |
|---|---|---|---|---|---|---|---|---|---|
|  |  |  |  | 8-2 | 8-3 | 8-4 | 1 | 2 | 3 |
| Supported catalyst | Support |  | Material | Mullite | Mullite | Mullite | $SiO_2$ | $Al_2O_3$ | Mullite |
|  |  |  | Particle diameter [μm] | 150 | 150 | 150 | 100 | 100 | 150 |
|  |  |  | Al content [mass %] | 32.3 | 32.3 | 32.3 | 0.0 | 53.0 | 32.3 |
|  |  |  | Si content [mass %] | 16.8 | 16.8 | 16.8 | 46.7 | 0.0 | 16.8 |
|  | Composite layer | Metal compound layer | Composition | $Al_2O_3$ | $Al_2O_3$ | $Al_2O_3$ | $Al_2O_3$ | $Al_2O_3$ | $Al_2O_3$ |
|  |  |  | Al content [mass %] | 52.9 | 52.9 | 52.9 | 52.9 | 52.9 | 52.9 |
|  |  |  | Equivalent thickness [nm] | 20 | 20 | 20 | 5 | 5 | 5 |
|  |  | Catalyst layer | Composition | — | Fe | — | Fe | Fe | Fe |
|  |  |  | Equivalent thickness [nm] | — | 1 | — | 0.5 | 0.5 | 1 |
|  |  | Mixed layer | Metal compound portion Composition | $Al_2O_3$ | — | $Al_2O_3$ | — | — | — |
|  |  |  | Al content [mass %] | 52.9 | — | 52.9 | — | — | — |
|  |  |  | Equivalent thickness [nm] | 0.5 | — | 0.5 | — | — | — |
|  |  |  | Catalyst portion Composition | Fe | — | Fe | — | — | — |
|  |  |  | Equivalent thickness [nm] | 1 | — | 1 | — | — | — |
|  |  | Covering layer | Composition | — | $Al_2O_3$ | $Al_2O_3$ | — | — | — |
|  |  |  | Al content [mass %] | — | 52.9 | 52.9 | — | — | — |
|  |  |  | Equivalent thickness [nm] | — | 0.5 | 0.5 | — | — | — |
|  |  |  | Number of layers repeated | 5 | 5 | 5 | — | — | 1 |
| CNT |  |  | Synthesis method | SCVD | SCVD | SCVD | FCVD | Not synthesizable | SCVD |
|  |  |  | Layer height [cm] | — | — | — | 3 | 3 | — |
|  |  |  | Synthesis temperature [° C.] | 800 | 800 | 800 | 800 | 800 | 800 |
|  |  |  | Carbon material | $C_2H_2$ | $C_2H_2$ | $C_2H_2$ | $C_2H_2$ | $C_2H_2$ | $C_2H_2$ |
|  |  |  | Carbon material gas flow rate [slm] | 0.5 | 0.5 | 0.5 | 2 | 2 | 0.5 |
|  |  |  | Carbon material conversion rate [mol %] | — | — | — | — | — | — |
|  |  |  | CNT yield [mass %] | — | — | — | — | — | — |
|  |  |  | Success or failure of CNT synthesis | A | A | A | B | Not evaluable | B |
| Evaluation |  |  | Fracture resistance | A | A | A | B | A | A |
|  |  |  | Use adequacy | A | A | A | A | B | A |

Tables 1 and 2 demonstrate that each supported catalyst having two or more composite layers on a support containing 10 mass % or more of each of Al and Si and having a volume-average particle diameter of 50 μm or more and 400 μm or less exhibited high fracture resistance and use adequacy and enabled CNT synthesis, indicating favorable catalytic activity. On the other hand, the supported catalysts of Comparative Examples 1 and 2 in which the support did not contain 10 mass % or more of each of Al and Si had insufficient fracture resistance and use adequacy. Moreover, it can be seen from Comparative Example 3 that the supported catalyst having mullite as a support but including only one composite layer had insufficient catalytic activity.

INDUSTRIAL APPLICABILITY

It is therefore possible to synthesize high-quality fibrous carbon nanostructures with high efficiency.

The invention claimed is:

1. A supported catalyst, comprising:
a support that is particulate; and
a composite layer laminate formed outside the support,
wherein the composite layer laminate is composed of n composite layers, where n is an integer of 2 or more and 20 or less,
each of the composite layers in the composite layer laminate includes a catalyst portion containing a catalyst and a metal compound portion containing a metal compound,
the support contains 10 mass % or more of each of Al and Si,
a volume-average particle diameter of the support itself is 50 μm or more and 400 μm or less, and
a specific surface area of the supported catalyst is 1 $m^2/g$ or less.

2. The supported catalyst according to claim 1,
wherein the metal compound portion contains 10 mass % or more of Al with respect to the total content of the metal compound contained in the metal compound portion of each composite layer.

3. The supported catalyst according to claim 1, wherein the catalyst portion contains at least metal of any of Fe, Co, and Ni.

4. The supported catalyst according to claim 1,
wherein the composite layer in the composite layer laminate includes a metal compound layer which is the metal compound portion in layer form, or a catalyst layer which is the catalyst portion in layer form.

5. The supported catalyst according to claim 1,
wherein n is 5 or more and 20 or less.

6. A method of producing fibrous carbon nanostructures, comprising:
a step of synthesizing fibrous carbon nanostructures on the supported catalyst according to claim 1; and
a peeling step of peeling the fibrous carbon nanostructures from the supported catalyst.

7. The method of producing fibrous carbon nanostructures according to claim 6, comprising
a supported catalyst regeneration step of subjecting the supported catalyst after the peeling step to a supported catalyst regeneration process.

8. The method of producing fibrous carbon nanostructures according to claim 7,
wherein the supported catalyst regeneration step includes:
a step of oxidizing a surface of the supported catalyst to obtain a reusable supported catalyst; and
a catalyst resupporting step of forming the composite layer including the metal compound portion and the catalyst portion, on a surface of the reusable supported catalyst.

9. A supported catalyst with fibrous carbon nanostructures, comprising:
the supported catalyst according to claim 1; and
fibrous carbon nanostructures formed on the supported catalyst.

* * * * *